United States Patent
Hagen

(10) Patent No.: US 8,089,293 B2
(45) Date of Patent: Jan. 3, 2012

(54) TEST AND MEASUREMENT INSTRUMENT AND METHOD OF CONFIGURING USING A SENSED IMPEDANCE

(75) Inventor: Michael S. Hagen, Vancouver, WA (US)

(73) Assignee: Tektronix, Inc., Beaverton, OR (US)

( * ) Notice: Subject to any disclaimer, the term of this patent is extended or adjusted under 35 U.S.C. 154(b) by 467 days.

(21) Appl. No.: 12/426,878

(22) Filed: Apr. 20, 2009

(65) Prior Publication Data

US 2010/0264946 A1 Oct. 21, 2010

(51) Int. Cl.
*G01R 31/20* (2006.01)

(52) U.S. Cl. ......... 324/754.01; 324/754.19; 324/756.06; 324/525

(58) Field of Classification Search ............. 324/754.01, 324/754.19, 756.06, 525
See application file for complete search history.

(56) References Cited

U.S. PATENT DOCUMENTS

| | | | | |
|---|---|---|---|---|
| 5,185,736 A | * | 2/1993 | Tyrrell et al. ................. | 370/358 |
| 5,633,801 A | * | 5/1997 | Bottman ........................ | 702/65 |
| 5,839,093 A | * | 11/1998 | Novosel et al. ................. | 702/59 |
| 5,939,875 A | * | 8/1999 | Felps et al. ..................... | 324/115 |
| 6,472,862 B1 | * | 10/2002 | Morgan ........................ | 324/525 |
| 6,519,538 B1 | * | 2/2003 | Bowman et al. ................. | 702/65 |
| 7,259,572 B2 | * | 8/2007 | Houldsworth et al. ........ | 324/677 |
| 7,472,026 B2 | * | 12/2008 | Premerlani et al. ............. | 702/59 |
| 7,495,450 B2 | * | 2/2009 | Furse et al. .................... | 324/519 |
| 7,710,122 B2 | * | 5/2010 | Crick ............................ | 324/509 |
| 7,852,094 B2 | * | 12/2010 | Chraft et al. ............. | 324/754.07 |
| 7,977,949 B2 | * | 7/2011 | Williams ....................... | 324/525 |
| 7,985,330 B2 | * | 7/2011 | Wang et al. .................... | 205/792 |
| 2005/0165323 A1 | * | 7/2005 | Montgomery et al. ........ | 600/544 |
| 2005/0264297 A1 | * | 12/2005 | Gorka ............................ | 324/525 |
| 2006/0220655 A1 | * | 10/2006 | Hoyte et al. ................... | 324/525 |
| 2010/0324548 A1 | * | 12/2010 | Godara et al. .................. | 606/34 |

* cited by examiner

*Primary Examiner* — Jermele M Hollington
*Assistant Examiner* — Lamarr Brown
(74) *Attorney, Agent, or Firm* — Derek Meeker; Thomas F. Lenihan

(57) ABSTRACT

A test and measurement instrument including a port including a plurality of connections; an impedance sense circuit configured to sense an impedance coupled to a connection of the plurality of connections; and a controller configured to setup the test and measurement instrument in response to a sensed impedance from the impedance sense circuit.

20 Claims, 2 Drawing Sheets

TEST AND MEASUREMENT INSTRUMENT AND METHOD OF CONFIGURING USING A SENSED IMPEDANCE

FIELD OF THE INVENTION

This disclosure relates to test and measurement instruments, in particular to test and measurement instruments and methods of configuring the same.

BACKGROUND

Test and measurement instruments can be used to analyze complex systems. For example, a logic analyzer can acquire hundreds of signals from such systems, if not more. However, to acquire such signals and present the signals to a user in an understandable manner, the logic analyzer must not only be appropriately configured, but also correctly connected to a particular device under test (DUT).

For example, a user can spend a significant amount of time connecting multiple probes of the logic analyzer to corresponding connectors on the DUT. A DUT can have multiple probe connectors for connecting to the logic analyzer. Once the DUT is connected, the user can spend even more time configuring the logic analyzer by labeling channels, setting thresholds, grouping signals, or the like. Each step in the setup process is an opportunity for user error.

SUMMARY

An embodiment includes a test and measurement instrument including a port including a plurality of connections; an impedance sense circuit configured to sense an impedance coupled to a connection of the plurality of connections; and a controller configured to setup the test and measurement instrument in response to a sensed impedance from the impedance sense circuit.

Another embodiment includes a method of configuring a test and measurement instrument including sensing an impedance coupled to the test and measurement instrument; identifying a configuration file by using the sensed impedance value; and configuring a setup of the test and measurement instrument using the configuration file.

Another embodiment includes a test and measurement instrument including a probe including a plurality of channels and an identification pin; and a processor. The processor is configured to receive an impedance measurement of the additional pin; and set up the probe in the test and measurement instrument in response to the impedance.

DETAILED DESCRIPTION

Embodiments include test and measurement instruments and techniques of configuring test and measurement instruments. In particular, in an embodiment, the setup of channels or other setup information can be automatically configured for the test and measurement instrument by sensing an impedance.

Figure 1:
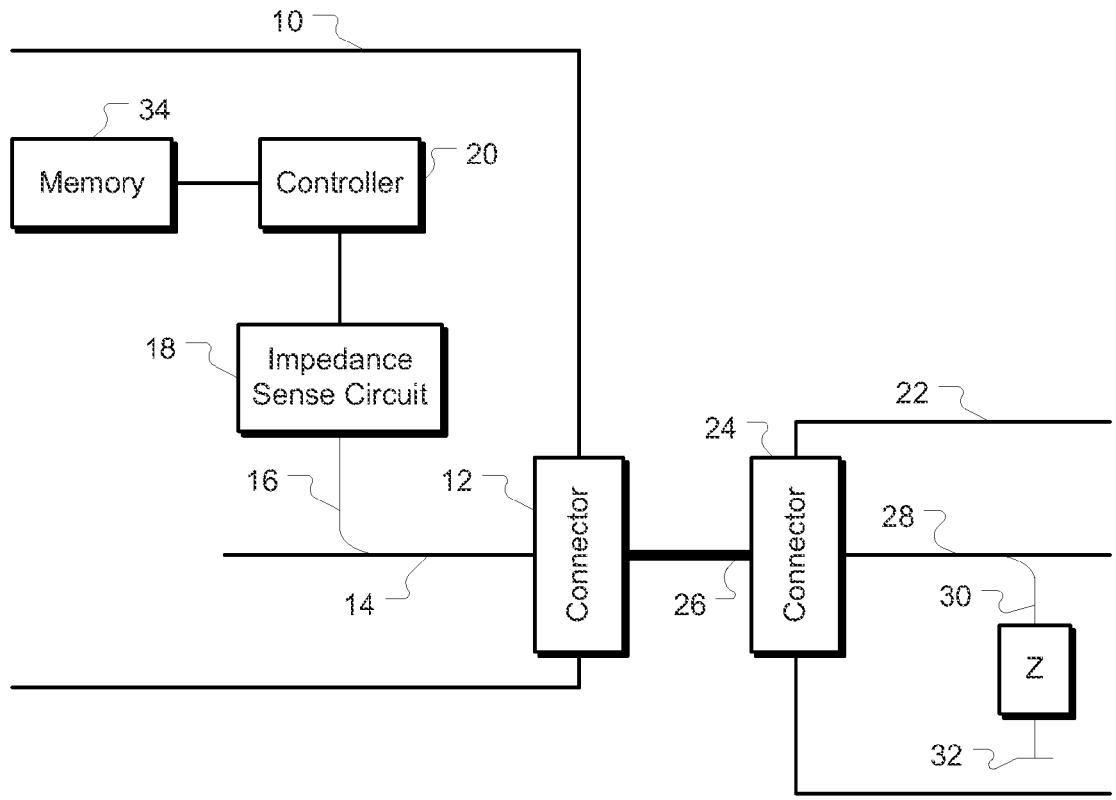
FIG. 1 is a block diagram of a test and measurement instrument with an impedance sense circuit according to an embodiment.

FIG. 1 is a block diagram of a test and measurement instrument with an impedance sense circuit according to an embodiment. In this embodiment, the test and measurement instrument 10 includes a connector 12. The connector 12 is an interface of the test and measurement instrument to a device under test (DUT) 22. For example, the connector 12 can be a connector to which a cable 26 is connected.

In an embodiment, the connector 12 can be a connector on the test and measurement instrument 10 for connection of a probe. The probe can include the cable 26 and have a connector for connection to the connector 24 on the DUT 22. Thus, through the connector 12, the test and measurement instrument 10 can access signals on the DUT 22.

As used herein, a port is a designation of an input and/or output structure of a test and measurement instrument. For example, a port can be the connector 12 of the test and measurement instrument, multiple connectors, a subset of connections of a connector, or the like. In addition, a port can include a cable with a connector at an end of the cable suitable for connecting to a DUT. A connector 12 will be used as an example of a port; however, in an embodiment, the configuration of a port can include configuration of channels associated with more than one connector 12.

In an embodiment, the connector 12 can include multiple connections illustrated by bus 14. For example, bus 14 can include ground connections, signal connections, or the like. One connection 16 in particular is coupled to an impedance sense circuit 18.

In an embodiment, the connection 16 can be an identification pin of the connector 12. The identification pin can be a pin of the connector 12 that is dedicated for the identification of the DUT 22. In another embodiment, the identification pin can be a pin that is typically used for a different purpose, for example, as a ground. For example, in an embodiment, the connector 12 can include a connection 16 that is specified as a ground. The specification as a ground can come from a standardized connector pin-out.

The impedance sense circuit 18 is configured to sense an impedance Z coupled to the connection 16. In this embodiment, the impedance Z is coupled to a set of connections 28 on the DUT. In particular, the impedance Z is coupled to a particular connection 30 of the connections 28. The impedance Z is coupled between the connection 30 and a reference terminal 32, such as a ground.

The impedance sense circuit 18 can be configured to sense a variety of impedances. For example, the impedance can be a resistance. In another example, the impedance can include inductances, capacitances, or the like. The impedance sense circuit 18 can be configured to sense negative impedances, for example, a negative impedance formed by an active circuit. Any aspect of an impedance can be sensed.

The impedance sense circuit 18 is coupled to a controller 20. The controller 20 is configured to setup the test and measurement instrument 10 in response to the sensed impedance from the impedance sense circuit 18. As used herein, the term "setup" includes The controller 20 is coupled to the impedance sense circuit 18. The controller 20 is configured to setup the test and measurement instrument in response to the sensed impedance from the impedance sense circuit 18. The controller 20 can include a variety of circuitry. For example, the controller 20 can include a processor configured to receive an impedance measurement. The processor can then set up the probe in the test and measurement instrument in response to the impedance. In another example, the controller 20 can be a part of a processing system of the test and measurement instrument 10. In particular, the controller 20 can have access to setup and/or configuration controls for the test and measurement instrument 10.

As described above, the test and measurement instrument 10 can be configured using the sensed impedance Z through a connection 16 specified as a ground. However, the use of a ground illustrates another aspect of the configuration. In particular, the probe connector can be coupled to a DUT 22 that does not have a particular impedance coupled to the ground connection. That is, the DUT 22 has the connection directly coupled to ground. Accordingly, the test and measurement instrument 10 can sense the connection to ground, for example by sensing a low resistance, and notify a user that the DUT 22 does not have an impedance for use in configuration and should be configured in another manner.

Figure 2:
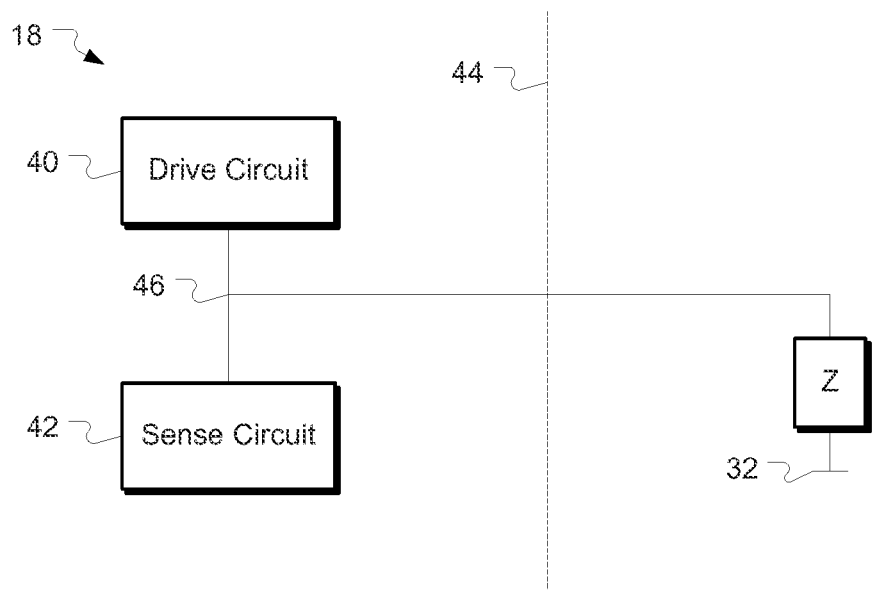
FIG. 2 is a block diagram illustrating a connection of the impedance sense circuit of FIG. 1 to an impedance of a device under test according to an embodiment.

FIG. 2 is a block diagram illustrating a connection of the impedance sense circuit of FIG. 1 to an impedance of a device under test according to an embodiment. In this embodiment, dashed line 44 delineates the boundary of the test and measurement instrument. The impedance sense circuit 18 includes a drive circuit 40 and a sense circuit 42. The drive circuit and the sense circuit are both coupled to the connection 46. The connection 46 is also coupled to the impedance Z.

The drive circuit 40 is configured to apply a stimulus to the connection 46. As used herein, a stimulus can be any variety of signal such that a desired characteristics if the impedance Z can be gleaned. The sense circuit 42 is configured to sense a response to the Although the impedance Z has been illustrated as single ended, the impedance Z that is sensed can be differential, in reference to multiple connections, or the like. That is, the impedance Z can be a differential impedance, a common mode impedance, or any other representation of an impedance. The use of a single ended impedance Z is only for illustration.

Figure 3:
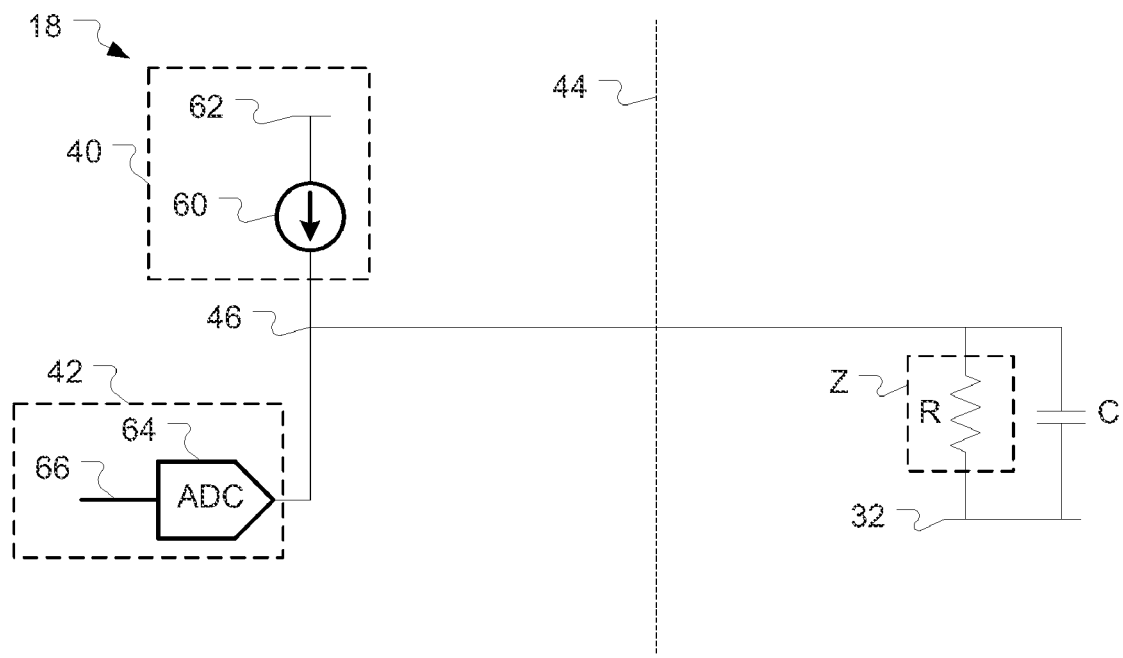
FIG. 3 is a schematic of an example of the impedance sense circuit and an impedance of a device under test of FIG. 1.

FIG. 3 is a schematic of an example of the impedance sense circuit and an impedance of a device under test of FIG. 1. In this example, the drive circuit includes a DC current source 60 coupled between the connection 46 and a power supply 62. Accordingly, the stimulus can be a DC current.

The impedance Z in this example is a resistor R. By applying the DC current from the DC current source 60 to the resistor R, a corresponding voltage should appear on the connection 46. An analog to digital converter (ADC) 64, in this example, operates as the sense circuit 42 and is configured to output a digital value 66 representing the voltage. Accordingly, the voltage induced on the connection 46 by the drive circuit 42 can be sensed by the sense circuit 64.

In this example, the impedance Z did not include the capacitance C. In an embodiment the capacitance C can provide an AC ground connection. For example, the connection 46 can be a connection that is specified as a ground. That is, the corresponding connector of the test and measurement instrument can have a specified pin-out. Accordingly, when it is connected to a DUT, the connection 46 could be used as a ground connection. However, in this embodiment, the resistor R is placed between the connection 46 and a ground 32. Accordingly, the ground connection is degraded. However, for AC signals, the parallel capacitor C can provide an AC ground, while still allowing the sensing of the resistor R.

However, in another embodiment, the capacitance C can be considered part of the impedance Z. Thus, the impedance Z can be the resistor R in parallel with the capacitor C. The drive circuit 40 and the sense circuit 42 can be configured appropriately to apply a stimulus to sense such an impedance Z. For example, the drive circuit 40 can drive the connection 46 a sinusoidal signal. The drive circuit 40 can have a particular output In another embodiment, the drive circuit can be a resistor coupled between the connection 46 and the power supply 62. Accordingly, a resistive divider can be formed with the resistor R. Given the resistor, the voltage of the power supply 62, and the sensed voltage, a measurement of the resistance can be obtained.

In another embodiment, the stimulus provided by the drive circuit 40 can be variable. For example, the drive circuit 40 can produce a step response. The sense circuit 42 can analyze the step response generated on the connection 46 to create an interpretation of the impedance Z.

Accordingly, the drive circuit 40 is configured to apply a stimulus to the connection. The sense circuit 42 is configured to sense a response on the connection 46. Regardless of the format of the stimulus and the sensed response, technique of applying or obtaining, or the like, the impedance coupled to the connection can be sensed.

Referring back to FIG. 1, the test and measurement instrument can include a memory 34. The memory 34 can be configured to store at least one configuration file. The memory 34 can be any type of data storage device or access to a data storage device. For example, a random access memory (RAM), local or remove network attached storage, removable media, or the like.

A configuration file is a file including a relationship of a configuration of a test and measurement instrument and an impedance. The relationship can, but need not be explicit. For example, the configuration file can be a net list. A net list is a representation of a schematic. For example, a net list can include entries corresponding to components such as resistors, capacitors, connectors, integrated circuits, or the like. Nodes can be defined in a net list that indicates how components are coupled. Such nodes can include labels. Thus, the net list includes an impedance which is associated with labels of nodes that can be used to configure the test and measurement instrument.

However, the configuration file need not include a schematic or other detailed representation of a DUT. The configuration file can be an association of an impedance and a stored configuration for the test and measurement instrument. Thus, upon sensing the impedance, the associated stored configuration can be loaded with or without any analysis of the configuration file.

However, the use of a net list, or other design related file can improve the productivity of a user. For example, the net list would likely be created for other purposed, such as simulation, layout, or the like. Accordingly, duplicate effort is reduced as the net list itself can be interrogated for the configuration.

In another embodiment, the configuration file can be generated using a current setup of the test and measurement instrument. For example, a user can connect one or more probes to a DUT. The DUT can have various impedances coupled to the probes. The user can setup the test and measurement instrument as desired. This setup can be stored in association with the configuration of impedances on the DUT. That is, the configuration file can include the impedances on the DUT and the setup of the test and measurement instrument. As a result, if the user disassembles the setup then reassemble the setup later, the test and measurement instrument can use the stored configuration file to configure the instrument. Moreover, if the user reassembles the setup differently than before, the test and measurement instrument can reconfigured the setup to accommodate the difference. For example, the test and measurement instrument can sense that impedances coupled to two probes have been swapped. The test and measurement instrument can automatically swap the configuration of the probes within the instrument.

In an embodiment, the memory 34 can be configured to store multiple net lists corresponding to multiple different circuits. The controller 20 can be configured to search the memory 34 for net lists. For example, the controller 20 can search the memory 34 for a net list including an impedance substantially equivalent to an impedance measurement. If a substantially matching impedance is found, the test and measurement instrument 10 can be setup using the net list.

Figure 4:
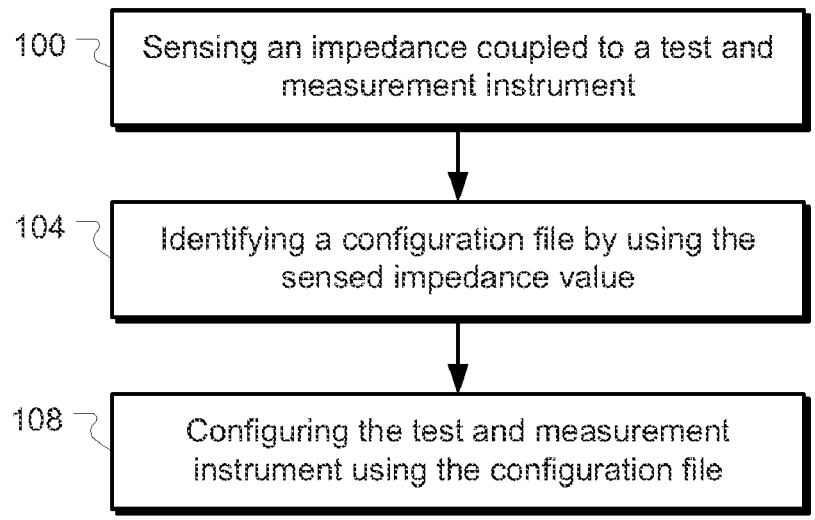
FIG. 4 is a flowchart illustrating a technique of configuring a setup of a test and measurement instrument.

FIG. 4 is a flowchart illustrating a technique of configuring a setup of a test and measurement instrument. In 100, an impedance coupled to the test and measurement instrument is sensed. As described above, the impedance can be sensed in a variety of ways. For example, an impedance coupled to a connection of a port can be sensed. In particular, the port can have multiple connections, and an impedance coupled to the connection can be sensed.

In an embodiment, the sensing can include sensing a resistance at a pin of a probe of the test and measurement instrument. As described above, a probe can include multiple input/output connections, ground connections, or the like. Each of these connections can be associated with one or more pins of the probe. In a particular example, a ground pin of the probe can be sensed for a resistance.

In an embodiment, the impedance can be sensed by applying a current to node to which the impedance is attached. For example, a current can be applied to a pin of the probe. As the current is being applied, a voltage on the pin can be measured. From the measured voltage, a measurement of the impedance can be obtained. For example, dividing the measured voltage by the applied current can give a measurement of resistance.

Although supplying current and measuring voltage has been described, other stimulus can be applied. For example a voltage can be applied and the current can be measured. As described above, the application of the stimulus and the monitoring can take a variety of forms. In particular, the forms can vary based on the type of impedance being sensed. In addition, although one technique of sensing the impedance can be applied in a test and measurement instrument, any number of different techniques can be used in the same test and measurement instrument.

In 104, a configuration file is identified using the impedance. As described above, the configuration file can be any type of file that includes an impedance and a relationship to a setup of the test and measurement instrument. In a particular example, the configuration file can be a net list.

Identification of the configuration file can include searching one or more net lists for an instance of a probe connector and a resistor where the resistor is coupled to a pin of the probe connector. For example, a probe connector can be identified in the net list. Other components coupled to the probe connector in the net list can be identified. Due to those identified components, can impedance can be created on a pin of the probe connector.

An impedance can be calculated using those components. In one example, calculating the impedance can include reading the value of the component, such as a resistance value. However, other calculations can include combining components, values, parameters, or the like together as described in the configuration file to obtain an impedance coupled to that pin. Regardless, the identified impedance can be compared to the sensed impedance.

In 108, a setup of the test and measurement instrument is configured using the configuration file. As described above, a configuration file has been identified. In an embodiment, the configuration file can include an instance of a probe connector. The probe connector can be associated with a port of the test and measurement instrument. The port can be configured using the configuration file.

For example, configuring the port can include assigning a label from the configuration file to a channel associated with the probe connector in response to the comparison. In In another example, configuring the port can include grouping channels associated with the probe connector in response to the comparison. For example, within a net list, multiple pins of the probe connector can be defined a part of a group, such as a data word. Accordingly, the port can be configured such that the test and measurement instrument treats signals on the associated pins as forming a data word and can represent the signals as a data word.

In an embodiment, the test and measurement instrument can be monitoring the impedance. For example, where the sensed impedance is the impedance coupled to a particular pin, the impedance coupled to that pin can be periodically sensed. Accordingly, the test and measurement instrument can respond to changes in the sensed impedance.

For example, if a probe is unconnected, the sensed impedance can be substantially equivalent to an open circuit. In this situation, the test and measurement instrument can interpret the open circuit as indicating that the probe is not connected. When the user couples the probe to a DUT, the test and measurement instrument can sense the change. Once a new impedance measurement is obtained, the test and measurement instrument can reconfigure itself automatically in response. For example, a particular test station can be configured to test a variety of DUTs, different versions of the same DUT, or the like. Each can have a different associated setup for the test and measurement instrument. In addition, each can have a different associated impedance. As new DUTs arrive at the station, the test and measurement instrument need not be manually reconfigured as a new configuration can be loaded once a new impedance is sensed.

Another embodiment includes an article of machine readable code embodied on a machine readable medium that when executed, causes the machine to perform any of the above described operations. An embodiment includes a machine readable storage medium storing machine readable code that when executed causes the machine to perform any of the above described operations. As used here, a machine is any device that can execute code. Microprocessors, programmable logic devices, multiprocessor systems, digital signal processors, personal computers, or the like are all examples of such a machine.

Although particular embodiments have been described, it will be appreciated that the principles of the invention are not limited to those embodiments. Variations and modifications may be made without departing from the principles of the invention as set forth in the following claims.

The invention claimed is:

1. A test and measurement instrument, comprising:
a port including a plurality of connections;
an impedance sense circuit configured to sense an impedance coupled to a connection of the plurality of connections; and
a controller configured to setup the test and measurement instrument in response to a sensed impedance from the impedance sense circuit.

2. The test and measurement instrument of claim 1, wherein:
the port includes a connection specified as a ground; and
the impedance sense circuit is coupled to the connection specified as the ground and is configured sense the impedance coupled to the connection specified as the ground.

3. The test and measurement instrument of claim 1, wherein the impedance sense circuit comprises:
a drive circuit coupled to the connection and configured to apply a stimulus to the connection; and
a sense circuit coupled to the connection and configured to sense a response to the stimulus on the connection.

4. The test and measurement instrument of claim 3, wherein the drive circuit comprises at least one of:
a resistor coupled between the connection and a power supply; and
a current source coupled to the connection.

5. The test and measurement instrument of claim 3, wherein the sense circuit comprises an analog-to-digital comparator coupled to the connection.

6. A method of configuring a test and measurement instrument, comprising:
sensing an impedance coupled to the test and measurement instrument;
identifying a configuration file using the impedance; and
configuring a setup of the test and measurement instrument using the configuration file.

7. The method of claim 6, wherein sensing the impedance comprises:
applying a current to a node to which the impedance is attached;
measuring a voltage on the node; and
determining the impedance from the measured voltage.

8. The method of claim 6, further comprising:
sensing the impedance coupled to a connection of a port with a plurality of connections.

9. The method of claim 6, further comprising:
identifying a probe connector in the configuration file;
identifying an impedance coupled to the probe connector in the configuration file; and
comparing the sensed impedance to the identified impedance.

10. The method of claim 9, further comprising:
associating a port of the test and measurement instrument with the probe connector; and
configuring the port of the test and measurement instrument using the configuration file.

11. The method of claim 10, further comprising:
assigning a label from the configuration file to a channel associated with the probe connector in response to the impedance.

12. The method of claim 10, further comprising:
assigning a threshold to a channel associated with the probe connector in response to the impedance.

13. The method of claim 10, further comprising:
grouping channels associated with the probe connector in response to the impedance.

14. The method of claim 6, wherein:
sensing the impedance comprises sensing a resistance at a pin of a probe of the test and measurement instrument; and
further comprising searching at least one net list for an instance of a probe connector and a resistor where the resistor is coupled to a pin of the probe connector.

15. The method of claim 14, further comprising:
assigning net names associated with the instance of the probe connector to channels of the probe.

16. The method of claim 6, further comprising:
monitoring the impedance for a changed impedance; and
reconfiguring the setup of the test and measurement instrument in response to the changed impedance.

17. A test and measurement instrument, comprising:
a probe including a plurality of channels and an identification pin; and
a processor program to:
receive an impedance measurement of the additional pin; and
setup the probe in the test and measurement instrument in response to the impedance.

18. The test and measurement instrument of claim 17, further comprising:
a memory configured to store at least one net list;
wherein the processor is program to:
search the memory to identify a net list including an impedance substantially equivalent to the impedance measurement; and
setup the probe in the test and measurement instrument in response to the net list.

19. The test and measurement instrument of claim 18, wherein the processor is program to apply a label from the identified net list to a setup for a channel of the probe.

20. The test and measurement instrument of claim 17, further comprising:
a memory;
wherein:
the probe is a first probe of a plurality of probes, each probe including a plurality of channels and an identification pin; and
the processor is program to store in the memory a setup of the test and measurement instrument and values of a plurality of impedances coupled to the identification pins of the probes.

* * * * *